United States Patent
Choi et al.

(10) Patent No.: US 8,178,392 B2
(45) Date of Patent: May 15, 2012

(54) ELECTRONIC SYSTEM WITH EXPANSION FEATURE

(75) Inventors: Haengcheol Choi, Kyonggi-do (KR); Ki Youn Jang, Ichon-si (KR); Taewoo Kang, Suwon-si (KR); Il Kwon Shim, Singapore (SG)

(73) Assignee: Stats Chippac Ltd., Singapore (SG)

( * ) Notice: Subject to any disclaimer, the term of this patent is extended or adjusted under 35 U.S.C. 154(b) by 374 days.

(21) Appl. No.: 11/750,715

(22) Filed: May 18, 2007

(65) Prior Publication Data

US 2008/0283998 A1   Nov. 20, 2008

(51) Int. Cl.
*H01L 21/00* (2006.01)
*H01L 23/48* (2006.01)
*H01L 23/52* (2006.01)
*H01L 29/40* (2006.01)

(52) U.S. Cl. ........ 438/108; 438/455; 438/613; 257/777; 257/778; 257/786; 257/E23.02

(58) Field of Classification Search .................. 257/786, 257/774; 438/108
See application file for complete search history.

(56) References Cited

U.S. PATENT DOCUMENTS

| | | | |
|---|---|---|---|
| 6,053,395 A | 4/2000 | Sasaki | |
| 6,268,568 B1* | 7/2001 | Kim | 174/250 |
| 6,667,190 B2 | 12/2003 | Kung et al. | |
| 6,717,264 B2 | 4/2004 | Ho et al. | |
| 6,759,318 B1 | 7/2004 | Chang | |
| 6,774,474 B1 | 8/2004 | Caletka et al. | |
| 6,774,497 B1 | 8/2004 | Qi et al. | |
| 6,974,330 B2* | 12/2005 | Caldwell et al. | 439/66 |
| 2004/0124007 A1* | 7/2004 | Ashida | 174/260 |
| 2005/0087364 A1* | 4/2005 | Umemoto | 174/260 |
| 2005/0282311 A1* | 12/2005 | Chen et al. | 438/108 |
| 2008/0185735 A1* | 8/2008 | Pham et al. | 257/778 |

* cited by examiner

*Primary Examiner* — Ha Tran T Nguyen
*Assistant Examiner* — Aaron Dehne
(74) *Attorney, Agent, or Firm* — Ishimaru & Associates LLP; Mikio Ishimaru; Stanley Chang (57) ABSTRACT

An electronic system is provided including forming a substrate having a radiating patterned pad, mounting an electrical device having an external interconnect over the radiating patterned pad with the external interconnect offset from the radiating patterned pad, and aligning the external interconnect with the radiating patterned pad.

20 Claims, 5 Drawing Sheets

ELECTRONIC SYSTEM WITH EXPANSION FEATURE

TECHNICAL FIELD

The present invention relates generally to an electronic system and more particularly to an electronic system with a substrate.

BACKGROUND ART

Across all sectors, industries, and geographies, demands continue for the electronic industry to provide products that are lighter, faster, smaller, multi-functional, more reliable, and more cost-effective. In order to meet these requirements of so many and varied consumers, more electrical circuits need to be more highly integrated to provide the functions demanded. Across virtually all applications, there continues to be growing demand for reducing size, increasing performance, and improving features of integrated circuits.

The seemingly endless requirements are no more visible than with products in our daily lives. Smaller and denser integrated circuits are required in many portable electronic products, such as cellular phones, portable computers, voice recorders, etc. as well as in many larger electronic systems, such as cars, planes, industrial control systems, etc.

As the demand grows for smaller electronic products with more features, manufacturers are seeking ways to include more features as well as reduce the size of the integrated circuits. Increased miniaturization of electronic products typically involves miniaturization of components, greater packaging density of integrated circuits ("ICs"), higher performance, and lower cost. As new generations of electronic products are released, the number of integrated circuits used to fabricate them tends to decrease due to advances in technology. Simultaneously, the functionality of these products increases.

Semiconductor package structures continue to advance toward miniaturization to increase the density of the components that are packaged therein while decreasing the sizes of the end products having the IC products. This is in response to continually increasing demands on information and communication apparatus for ever-reduced sizes, thicknesses, and costs, along with ever-increasing performance.

Different challenges arise from increased functionality integration and miniaturization. For example, a semiconductor product having increased functionality may be made smaller but may still be required to provide a large number of inputs/outputs (I/O) interface. The size reduction increases the I/O density for the integrated circuit package and its respective integrated circuit carriers.

The ever-increasing I/O density trend presents a myriad of manufacturing problems. Some of these problems reside integrated circuit manufacturing realm. Others problems involve mounting these increase I/O density integrated circuits on carriers for packaging.

For example, attaching integrated circuits onto a carrier typically involve subjecting the carrier to elevated temperatures for forming electrical and mechanical connections between the integrated circuit and the carrier. These elevated temperatures may cause the integrated circuits and the carrier to expand at different rates creating problems at the contact points.

For example, flip-chip packaging technology has found widespread use because of its advantage in size, performance, flexibility, reliability and cost over other packaging methods. Flip chip packaging employs direct electrical connection of face-down integrated circuit (IC) chips onto substrates, circuit boards, or carriers, by means of conductive bumps on the chip bond pads, replacing older wire bonding technology where face-up chips sit on substrates with wire connection to each bond pad.

During flip chip packaging, the IC chip with bump array can be placed facedown on a substrate with a matching bump array, and the assembly is heated to make a solder connection. Typically, flip chip packages provide fine bump pitch, small bump pad diameter, and large die size. The flip chip attributes in conjunction with the heating or reflow process cause manufacturing problems. For example, the expansion rate difference between the integrated circuit and the substrate during reflow results in reliability problems at the connection between the integrated circuits and the substrate.

Thus, a need still remains for an electronic system providing low cost manufacturing, improved yield, device integration, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an electronic system including forming a substrate having a radiating patterned pad, mounting an electrical device having an external interconnect over the radiating patterned pad with the external interconnect offset from the radiating patterned pad, and aligning the external interconnect with the radiating patterned pad.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Figure 1:
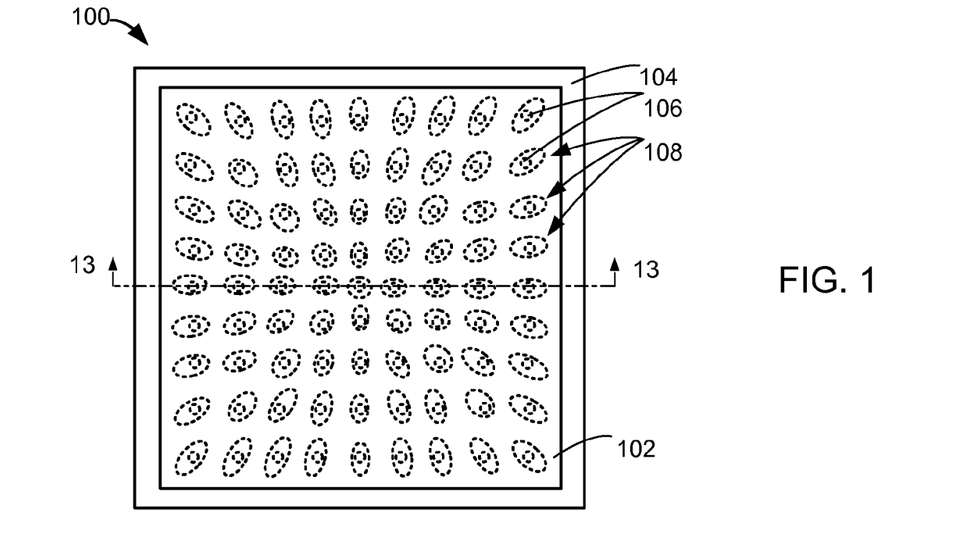
FIG. 1 is a top view of an electronic system in a first embodiment of the present invention.

Referring now to FIG. 1, therein is shown a top view of an electronic system 100 in a first embodiment of the present invention. The top view depicts an electrical device 102, such as integrated circuit die, a flip chip, or a package integrated circuit, over a substrate 104. For example, the substrate 104 may be a laminate substrate.

The top view also depicts external interconnects 106, such as solder bumps or solder balls, of the electrical device 102 over radiating patterned pads 108 exposed by the substrate 104. Both the external interconnects 106 and the radiating patterned pads 108 as shown as dotted lines.

For illustrative purposes, the electrical device 102 has the external interconnects 106 are shown in an array configuration, although it is understood that the electrical device 102 may have the external interconnects 106 in a different configuration. For example, the electrical device 102 may have the external interconnects in a peripheral configuration, a mixed array configuration with different densities of the external interconnects 106, or partially depopulated configuration with not all available slots for the external interconnects 106 have the external interconnects 106.

Figure 2:
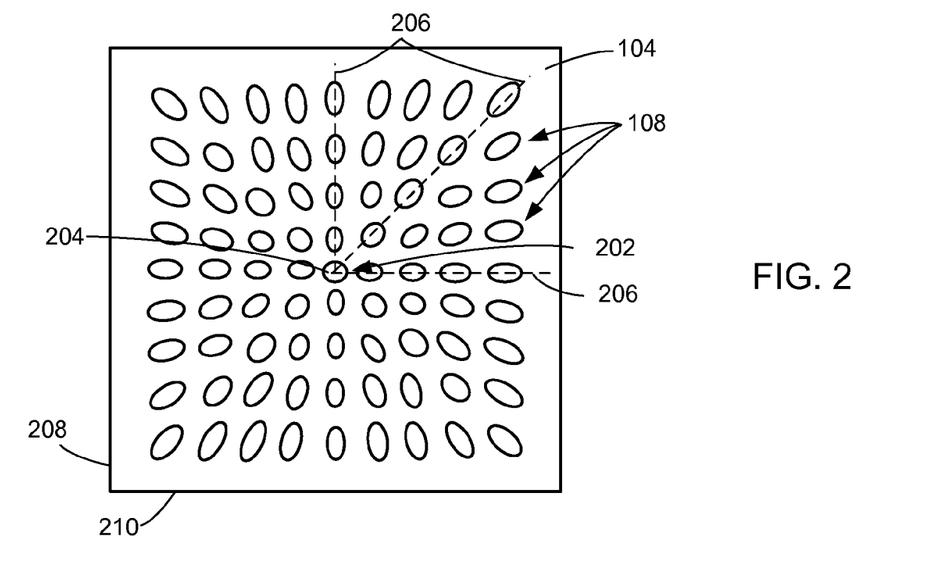
FIG. 2 is a top view of the substrate of the electronic system of FIG. 1.

Referring now to FIG. 2, therein is shown a top view of the substrate 104 of the electronic system 100 of FIG. 1. The substrate 104 has the radiating patterned pads 108 from a center 202 of the substrate 104. The center 202 may preferably represent the center of the substrate 104 or the center of the radiating patterned pads 108 exposed by the substrate 104.

The center 202 preferably includes a center pad 204, wherein the center pad 204 preferably has a circular geometric configuration. The radiating patterned pads 108 extend from the center pad 204 along radiating lines 206 depicted by a dotted line. Each of the radiating patterned pads 108 extending from the center pad 204 has an elliptical geometric configuration with a major axis of the elliptical configuration coincident with one of the radiating lines 206. The radiating patterned pads 108 having the elliptical geometric configuration has minor axis that is orthogonal to one of the radiating lines 206. The major axis of the radiating patterned pads 108 is aligned with the center pad 204. A portion of the radiating lines 206 extend from the center pad 204 orthogonal to first sides 208 and second sides 210 of the substrate 104, wherein the first sides 208 are perpendicular to the second sides 210.

Figure 3:
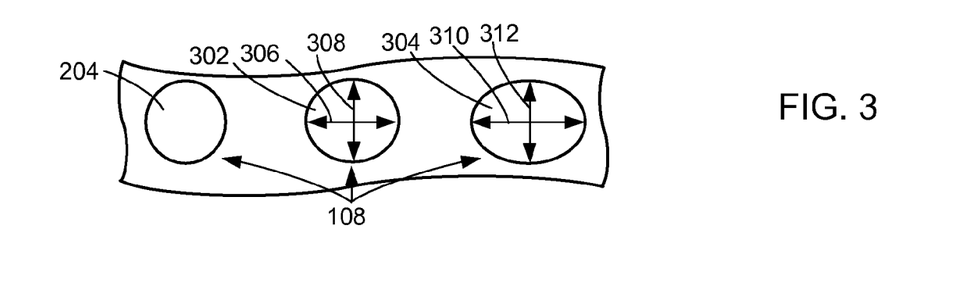
FIG. 3 is a more detailed top view of a portion of the substrate of FIG. 2.

Referring now to FIG. 3, therein is shown a more detailed top view of a portion of the substrate 104 of FIG. 2. The more detailed top view depicts the center pad 204, a middle pad 302, and an outer pad 304 of the radiating patterned pads 108 along one of the radiating lines 206 of FIG. 2. The outer pad 304 represents the outer most pad of the radiating patterned pads 108 along one of the radiating lines 206. The middle pad 302 is an exemplary pad of the radiating patterned pads 108 between the center pad 204 and the outer pad 304 along the same instance of the radiating lines 206.

As described earlier, the center pad 204 preferably has substantially a circular geometric configuration. The middle pad 302 and the outer pad 304 preferably have elliptical geometric configurations. The middle pad 302 has a first major axis dimension 306 and a first minor axis dimension 308. The outer pad 304 has a second major axis dimension 310 and a second minor axis dimension 312.

The radiating patterned pads 108 along one of the radiating lines 206 preferably have the first minor axis dimension 308 substantially the same as the second minor axis dimension 312. The first minor axis dimension 308 and the second minor axis dimension 312 are shown substantially the same as the diameter of the center pad 204.

The radiating patterned pads 108 along one of the radiating lines preferably has the first major axis dimension 306 less than the second major axis dimension 310 representing an increasing trend of the major axis dimensions of the radiating patterned pads 108 from the center pad 204 to the outer pad 304.

The increase of the major axis dimensions of the radiating patterned pads 108 from the center pad 204 to the outer pad 304 allows for accommodating expansion rate difference between the substrate 104 and the electrical device 102 of FIG. 1 during a reflow process. The radiating patterned pads 108 enable the external interconnects 106 of FIG. 1 to be aligned with the radiating patterned pads 108 post the reflow process.

For illustrative purposes, the radiating patterned pads 108 along one of the radiating lines 206 are shown having substantially the same minor axis dimensions, although it is understood that the minor axis dimensions may be different. For example, the minor axis dimensions may have an increasing trend or decreasing trend for the radiating patterned pads 108 from the center pad 204 to the outer pad 304.

Also for illustrative purposes, the center pad 204 is described having a circular geometric configuration, although it is understood that the center pad 204 may have a different configuration. For example, the center pad 204 may have an elliptical geometric configuration with similar but not the same dimension along minor axis and major axis.

The minor axis dimensions of the radiating patterned pads 108 may vary, such as increasing or decreasing, between the radiating lines 206 perpendiculars to the first sides 208 of FIG. 2 and the second sides 210 of FIG. 2. The rate of change of the major axis dimensions of the radiating patterned pads 108 may preferably vary, such as increasing or decreasing, between the radiating lines 206 perpendiculars to the first sides 208 and the second sides 210.

Also, the rate of change of the major axis dimensions, the minor axis dimensions, or a combination thereof of the radiating patterned pads 108 may preferably vary for accommodating difference in the expansion rate within the substrate 104 or the electrical device 102. For example, the substrate 104 may not expand uniformly and may vary due to different densities of electrical vias (not shown) and traces (now shown) in the substrate 104.

Figure 4:
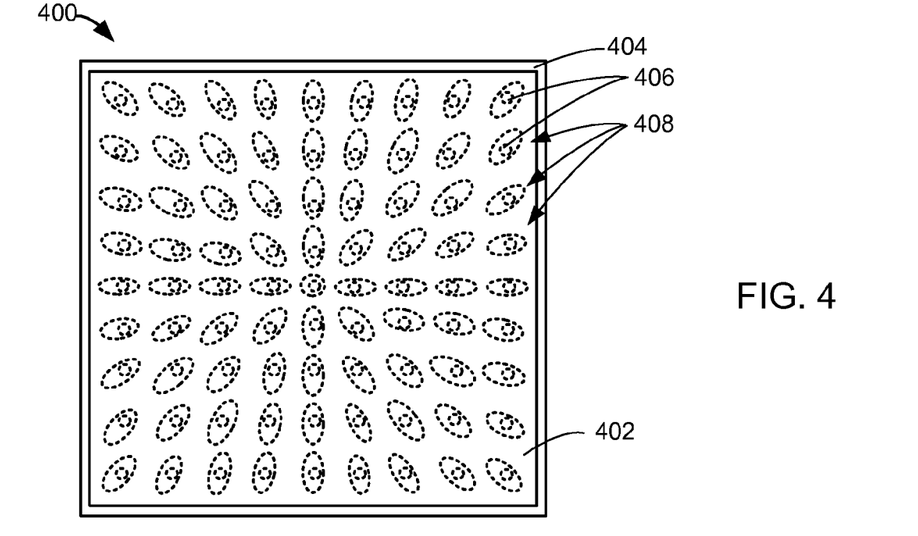
FIG. 4 is a top view of an electronic system in a second embodiment of the present invention.

Referring now to FIG. 4, therein is shown a top view of an electronic system 400 in a second embodiment of the present invention. The top view depicts an electrical device 402, such as integrated circuit die, a flip chip, or a package integrated circuit, over a substrate 404. For example, the substrate 404 may be a laminate substrate.

The top view also depicts external interconnects 406, such as solder bumps or solder balls, of the electrical device 402 over radiating patterned pads 408 exposed by the substrate 404. Both the external interconnects 406 and the radiating patterned pads 408 as shown as dotted lines.

For illustrative purposes, the electrical device 402 has the external interconnects 406 are shown in an array configuration, although it is understood that the electrical device 402 may have the external interconnects 406 in a different configuration. For example, the electrical device 402 may have the external interconnects in a peripheral configuration, a mixed array configuration with different densities of the external interconnects 406, or partially depopulated configuration with not all available slots for the external interconnects 406 have the external interconnects 406.

Figure 5:
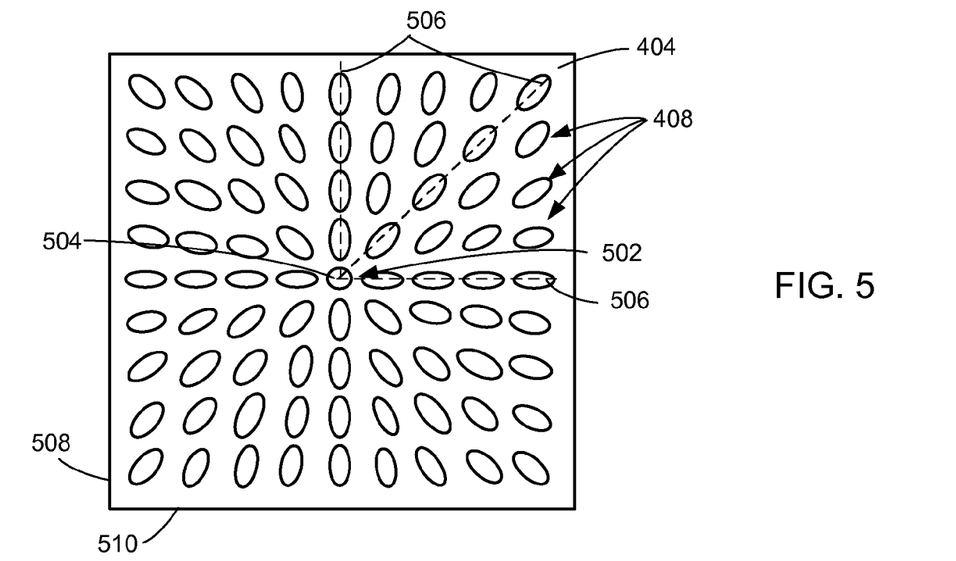
FIG. 5 is a top view of the substrate of the electronic system of FIG. 4.

Referring now to FIG. 5, therein is shown a top view of the substrate 404 of the electronic system 400 of FIG. 4. The substrate 404 has the radiating patterned pads 408 from a center 502 of the substrate 404. The center 502 may preferably represent the center of the substrate 404 or the center of the radiating patterned pads 408 exposed by the substrate 404.

The center 502 preferably includes a center pad 504, wherein the center pad 504 preferably has a circular geometric configuration. The radiating patterned pads 408 extend from the center pad 504 along radiating lines 506 depicted by a dotted line. Each of the radiating patterned pads 408 extending from the center pad 504 has an elliptical geometric configuration with a major axis of the elliptical configuration coincident with one of the radiating lines 506. The radiating patterned pads 408 having the elliptical geometric configuration has minor axis that is orthogonal to one of the radiating lines 506. A portion of the radiating lines 506 extend from the center pad 504 orthogonal to first sides 508 and second sides 510 of the substrate 404, wherein the first sides 508 are perpendicular to the second sides 510.

Figure 6:
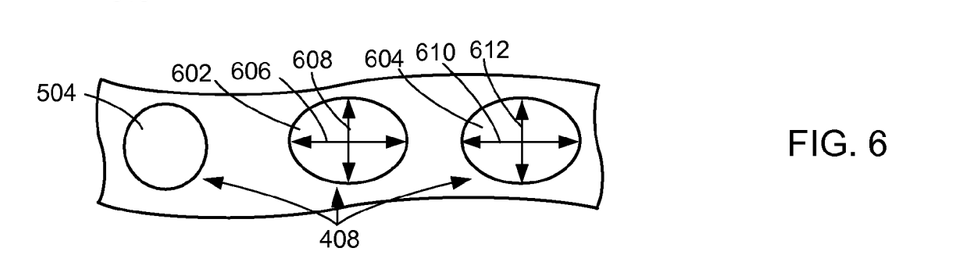
FIG. 6 is a more detailed top view of a portion of the substrate of FIG. 5.

Referring now to FIG. 6, therein is shown a more detailed top view of a portion of the substrate 404 of FIG. 5. The more detailed top view depicts the center pad 504, a middle pad 602, and an outer pad 604 of the radiating patterned pads 408 along one of the radiating lines 506 of FIG. 5. The outer pad 604 represents the outer most pad of the radiating patterned pads 408 along one of the radiating lines 506. The middle pad 602 is an exemplary pad of the radiating patterned pads 408 between the center pad 504 and the outer pad 604 along the same instance of the radiating lines 506.

As described earlier, the center pad 504 preferably has substantially a circular geometric configuration. The middle pad 602 and the outer pad 604 preferably have an elliptical geometric configuration. The middle pad 602 has a first major axis dimension 606 and a first minor axis dimension 608. The outer pad 604 has a second major axis dimension 610 and a second minor axis dimension 612.

The radiating patterned pads 408 along one of the radiating lines 506 preferably have the first minor axis dimension 608 substantially the same as the second minor axis dimension 612. The first minor axis dimension 608 and the second minor axis dimension 612 are shown substantially the same as the diameter of the center pad 504.

The radiating patterned pads 408 along one of the radiating lines preferably has the first major axis dimension 606 substantially the same with the second major axis dimension 610 representing constant of the major axis dimensions of the radiating patterned pads 408 from the center pad 504 to the outer pad 604.

The major axis dimension of the radiating patterned pads 408 from the center pad 504 to the outer pad 604 allows for accommodating expansion rate difference between the substrate 404 and the electrical device 102 of FIG. 1 during a reflow process. The radiating patterned pads 408 enable the external interconnects 106 of FIG. 1 to be aligned with the radiating patterned pads 408 post the reflow process.

For illustrative purposes, the radiating patterned pads 408 along one of the radiating lines 506 are shown having substantially the same minor axis dimensions, although it is understood that the minor axis dimensions may be different. For example, the minor axis dimensions may have an increasing trend or decreasing trend for the radiating patterned pads 408 from the center pad 504 to the outer pad 604.

Also for illustrative purposes, the center pad 504 is described having a circular geometric configuration, although it is understood that the center pad 504 may have a different configuration. For example, the center pad 504 may have an elliptical geometric configuration with similar but not the same dimension along minor axis and major axis.

The minor axis dimensions of the radiating patterned pads 408 may vary, such as increasing or decreasing, between the radiating lines 506 perpendiculars to the first sides 208 of FIG. 2 and the second sides 210 of FIG. 2. The major axis dimensions of the radiating patterned pads 408 may vary, such as increasing or decreasing, between the radiating lines 506 perpendiculars to the first sides 508 and the second sides 510.

Also, the rate of change of the major axis dimensions, the minor axis dimensions, or a combination thereof of the radiating patterned pads 408 may preferably vary for accommodating difference in the expansion rate within the substrate 404 or the electrical device 402. For example, the substrate 404 may not expand uniformly and may vary due to different densities of electrical vias (not shown) and traces (now shown) in the substrate 404.

Figure 7:
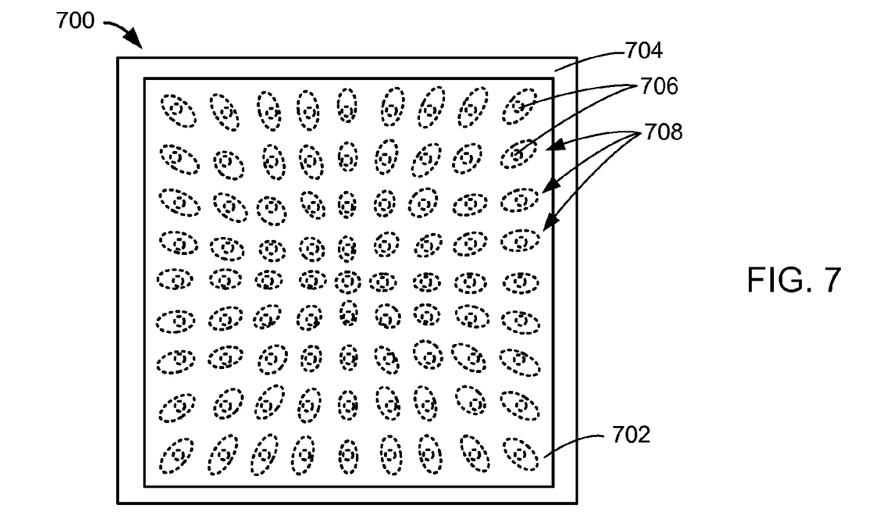
FIG. 7 is a top view of an electronic system in a third embodiment of the present invention.

Referring now to FIG. 7, therein is shown a top view of an electronic system 700 in a third embodiment of the present invention. The top view depicts an electrical device 702, such as integrated circuit die, a flip chip, or a package integrated circuit, over a substrate 704. For example, the substrate 704 may be a laminate substrate.

The top view also depicts external interconnects 706, such as solder bumps or solder balls, of the electrical device 702 over radiating patterned pads 708 exposed by the substrate 704. Both the external interconnects 706 and the radiating patterned pads 708 as shown as dotted lines.

For illustrative purposes, the electrical device 702 has the external interconnects 706 are shown in an array configuration, although it is understood that the electrical device 702 may have the external interconnects 706 in a different configuration. For example, the electrical device 702 may have the external interconnects in a peripheral configuration, a mixed array configuration with different densities of the external interconnects 706, or partially depopulated configuration with not all available slots for the external interconnects 706 have the external interconnects 706.

Figure 8:
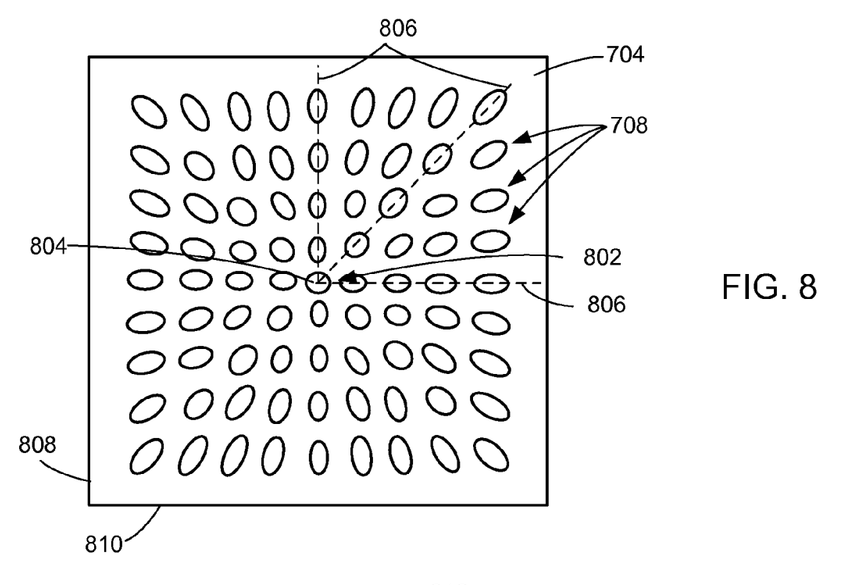
FIG. 8 is a top view of the substrate of the electronic system of FIG. 7.

Referring now to FIG. 8, therein is shown a top view of the substrate 704 of the electronic system 700 of FIG. 7. The substrate 704 has the radiating patterned pads 708 from a center 802 of the substrate 704. The center 802 may preferably represent the center of the substrate 704 or the center of the radiating patterned pads 708 exposed by the substrate 704.

The center 802 preferably includes a center pad 804, wherein the center pad 804 preferably has a circular geometric configuration. The radiating patterned pads 708 extend from the center pad 804 along radiating lines 806 depicted by a dotted line. Each of the radiating patterned pads 708 extending from the center pad 804 has an oval geometric configuration with a major axis of the oval configuration coincident with one of the radiating lines 806. The radiating patterned pads 708 having the oval geometric configuration has minor axis that is orthogonal to one of the radiating lines 806. The oval geometric configuration is symmetric only along the major axis whereas the elliptical geometric configuration is symmetric along both the major axis and the minor axis. A portion of the radiating lines 806 extend from the center pad 804 orthogonal to first sides 808 and second sides 810 of the substrate 704, wherein the first sides 808 are perpendicular to the second sides 810.

Figure 9:
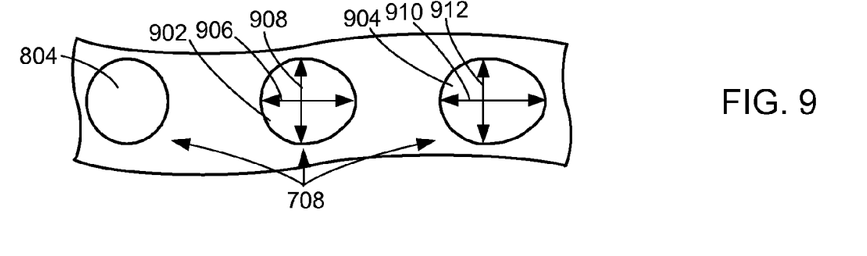
FIG. 9 is a more detailed top view of a portion of the substrate of FIG. 8.

Referring now to FIG. 9, therein is shown a more detailed top view of a portion of the substrate 704 of FIG. 8. The more detailed top view depicts the center pad 804, a middle pad 902, and an outer pad 904 of the radiating patterned pads 708 along one of the radiating lines 806 of FIG. 8. The outer pad 904 represents the outer most pad of the radiating patterned pads 708 along one of the radiating lines 806. The middle pad 902 is an exemplary pad of the radiating patterned pads 708 between the center pad 804 and the outer pad 904 along the same instance of the radiating lines 806.

As described earlier, the center pad 804 preferably has substantially a circular geometric configuration. The middle pad 902 and the outer pad 904 preferably have oval geometric configurations. The middle pad 902 has a first major axis dimension 906 and a first minor axis dimension 908. The outer pad 904 has a second major axis dimension 910 and a second minor axis dimension 912.

The radiating patterned pads 708 along one of the radiating lines 806 preferably have the first minor axis dimension 908 substantially the same as the second minor axis dimension 912. The first minor axis dimension 908 and the second minor axis dimension 912 are shown substantially the same as the diameter of the center pad 804.

The radiating patterned pads 708 along one of the radiating lines preferably has the first major axis dimension 906 less than the second major axis dimension 910 representing an increasing trend of the major axis dimensions of the radiating patterned pads 708 from the center pad 804 to the outer pad 904.

The increase of the major axis dimensions of the radiating patterned pads 708 from the center pad 804 to the outer pad 904 allows for accommodating expansion rate difference between the substrate 704 and the electrical device 102 of FIG. 1 during a reflow process. The radiating patterned pads 708 enable the external interconnects 106 of FIG. 1 to be aligned with the radiating patterned pads 708 post the reflow process.

For illustrative purposes, the radiating patterned pads 708 along one of the radiating lines 806 are shown having substantially the same minor axis dimensions, although it is understood that the minor axis dimensions may be different. For example, the minor axis dimensions may have an increasing trend or decreasing trend for the radiating patterned pads 708 from the center pad 804 to the outer pad 904.

Also for illustrative purposes, the center pad 804 is described having a circular geometric configuration, although it is understood that the center pad 804 may have a different configuration. For example, the center pad 804 may have an oval geometric configuration with similar but not the same dimension along minor axis and major axis.

The minor axis dimensions of the radiating patterned pads 708 may vary, such as increasing or decreasing, between the radiating lines 806 perpendiculars to the first sides 208 of FIG. 2 and the second sides 210 of FIG. 2. The rate of change of the major axis dimensions of the radiating patterned pads 708 may preferably vary, such as increasing or decreasing, between the radiating lines 806 perpendiculars to the first sides 808 and the second sides 810.

Also, the rate of change of the major axis dimensions, the minor axis dimensions, or a combination thereof of the radiating patterned pads 708 may preferably vary for accommodating difference in the expansion rate within the substrate 704 or the electrical device 702. For example, the substrate 704 may not expand uniformly and may vary due to different densities of electrical vias (not shown) and traces (now shown) in the substrate 704.

Figure 10:
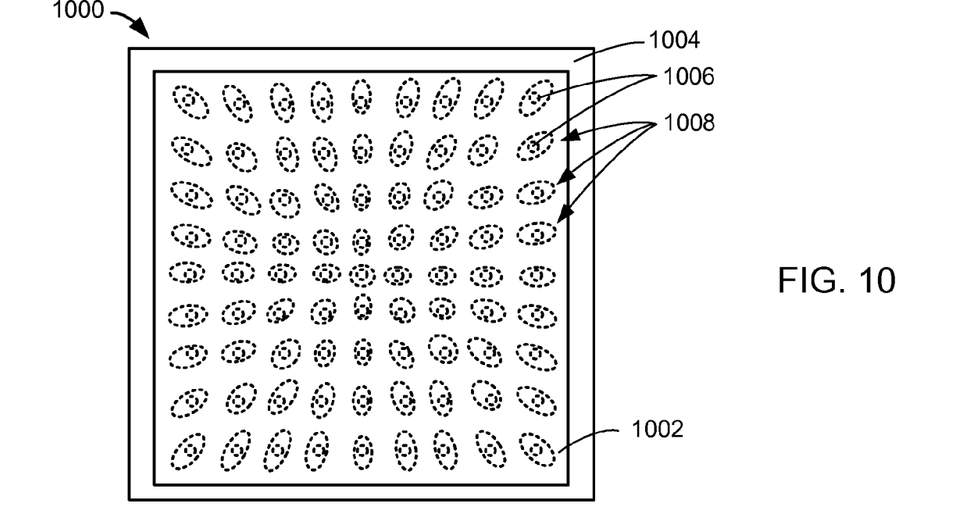
FIG. 10 is a top view of an electronic system in a fourth embodiment of the present invention.

Referring now to FIG. 10, therein is shown a top view of an electronic system 1000 in a fourth embodiment of the present invention. The top view depicts an electrical device 1002, such as integrated circuit die, a flip chip, or a package integrated circuit, over a substrate 1004. For example, the substrate 1004 may be a laminate substrate.

The top view also depicts external interconnects 1006, such as solder bumps or solder balls, of the electrical device 1002 over radiating patterned pads 1008 exposed by the substrate 1004. Both the external interconnects 1006 and the radiating patterned pads 1008 as shown as dotted lines.

For illustrative purposes, the electrical device 1002 has the external interconnects 1006 are shown in an array configuration, although it is understood that the electrical device 1002 may have the external interconnects 1006 in a different configuration. For example, the electrical device 1002 may have the external interconnects in a peripheral configuration, a mixed array configuration with different densities of the external interconnects 1006, or partially depopulated configuration with not all available slots for the external interconnects 1006 have the external interconnects 1006.

Figure 11:
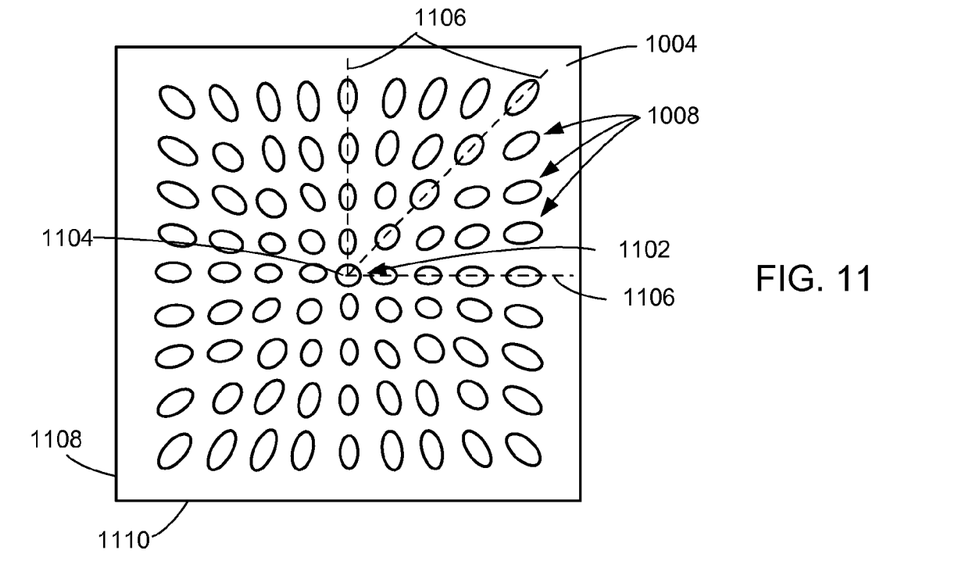
FIG. 11 is a top view of the substrate of the electronic system of FIG. 10.

Referring now to FIG. 11, therein is shown a top view of the substrate 1004 of the electronic system 1000 of FIG. 10. The substrate 1004 has the radiating patterned pads 1008 from a center 1102 of the substrate 1004. The center 1102 may preferably represent the center of the substrate 1004 or the center of the radiating patterned pads 1008 exposed by the substrate 1004.

The center 1102 preferably includes a center pad 1104, wherein the center pad 1104 preferably has a circular geometric configuration. The radiating patterned pads 1008 extend from the center pad 1104 along radiating lines 1106 depicted by a dotted line. Each of the radiating patterned pads 1008 extending from the center pad 1104 has an oval geometric configuration with a major axis of the oval configuration coincident with one of the radiating lines 1106. The radiating patterned pads 1008 having the oval geometric configuration has minor axis that is orthogonal to one of the radiating lines 1106. The oval geometric configuration is symmetric only along the major axis whereas the elliptical geometric configuration is symmetric along both the major axis and the minor axis. A portion of the radiating lines 1106 extend from the center pad 1104 orthogonal to first sides 1108 and second sides 1110 of the substrate 1004, wherein the first sides 1108 are perpendicular to the second sides 1110.

Figure 12:
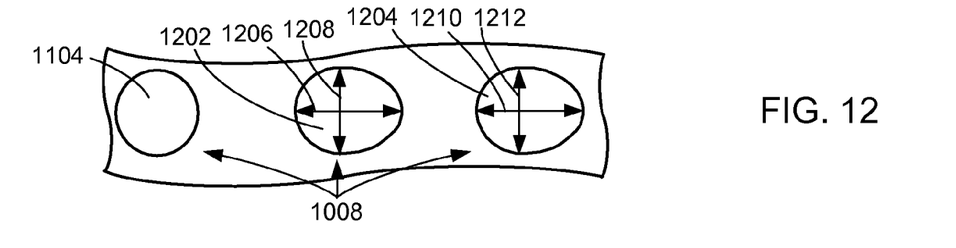
FIG. 12 is a more detailed top view of a portion of the substrate of FIG. 11.

Referring now to FIG. 12, therein is shown a more detailed top view of a portion of the substrate 1004 of FIG. 11. The more detailed top view depicts the center pad 1104, a middle pad 1202, and an outer pad 1204 of the radiating patterned pads 1008 along one of the radiating lines 1106 of FIG. 11. The outer pad 1204 represents the outer most pad of the radiating patterned pads 1008 along one of the radiating lines 1106. The middle pad 1202 is an exemplary pad of the radiating patterned pads 1008 between the center pad 1104 and the outer pad 1204 along the same instance of the radiating lines 1106.

As described earlier, the center pad 1104 preferably has substantially a circular geometric configuration. The middle pad 1202 and the outer pad 1204 preferably have an oval geometric configuration. The middle pad 1202 has a first major axis dimension 1206 and a first minor axis dimension 1208. The outer pad 1204 has a second major axis dimension 1210 and a second minor axis dimension 1212.

The radiating patterned pads 1008 along one of the radiating lines 1106 preferably has the first minor axis dimension 1208 substantially the same as the second minor axis dimension 1212. The first minor axis dimension 1208 and the second minor axis dimension 1212 are shown substantially the same as the diameter of the center pad 1104.

The radiating patterned pads 1008 along one of the radiating lines preferably has the first major axis dimension 1206 substantially the same with the second major axis dimension 1210 representing constant of the major axis dimensions of the radiating patterned pads 1008 from the center pad 1104 to the outer pad 1204.

The major axis dimension of the radiating patterned pads 1008 from the center pad 1104 to the outer pad 1204 allows for accommodating expansion rate difference between the substrate 1004 and the electrical device 102 of FIG. 1 during a reflow process. The radiating patterned pads 1008 enable the external interconnects 106 of FIG. 1 to be aligned with the radiating patterned pads 1008 post the reflow process.

For illustrative purposes, the radiating patterned pads 1008 along one of the radiating lines 1106 are shown having substantially the same minor axis dimensions, although it is understood that the minor axis dimensions may be different. For example, the minor axis dimensions may have an increasing trend or decreasing trend for the radiating patterned pads 1008 from the center pad 1104 to the outer pad 1204.

Also for illustrative purposes, the center pad 1104 is described having a circular geometric configuration, although it is understood that the center pad 1104 may have a different configuration. For example, the center pad 1104 may have an oval geometric configuration with similar but not the same dimension along minor axis and major axis.

The minor axis dimensions of the radiating patterned pads 1008 may vary, such as increasing or decreasing, between the radiating lines 1106 perpendicular to the first sides 208 of FIG. 2 and the second sides 210 of FIG. 2. The major axis dimensions of the radiating patterned pads 1008 may vary, such as increasing or decreasing, between the radiating lines 1106 perpendicular to the first sides 1108 and the second sides 1110.

Also, the rate of change of the major axis dimensions, the minor axis dimensions, or a combination thereof of the radiating patterned pads 1008 may preferably vary for accommodating difference in the expansion rate within the substrate 1004 or the electrical device 1002. For example, the substrate 1004 may not expand uniformly and may vary due to different densities of electrical vias (not shown) and traces (now shown) in the substrate 1004.

Figure 13:
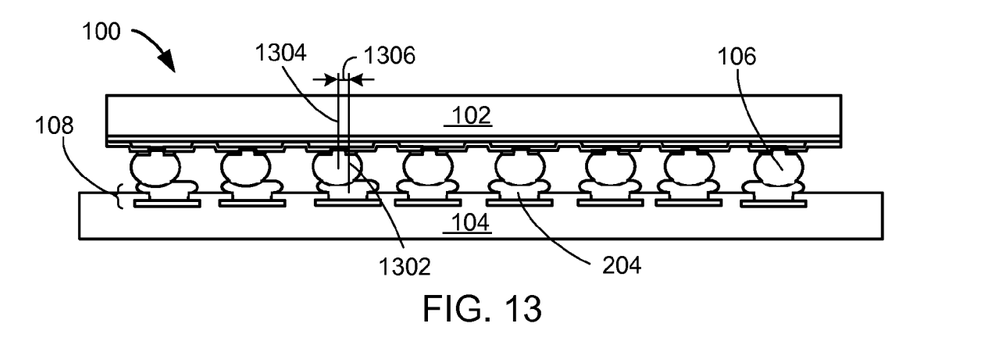
FIG. 13 is a cross-sectional view of the electronic system of FIG. 1 along line 13-13 in a mounting phase of the electrical device.

Referring now to FIG. 13, therein is shown a cross-sectional view of the electronic system 100 of FIG. 1 along line 13-13 in a mounting phase of the electrical device 102. The cross-sectional view depicts the electrical device 102 over the radiating patterned pads 108 of the substrate 104. The radiating patterned pads 108 are partially embedded within the substrate 104 and partially exposed and protruded from the substrate 104.

Each of the radiating patterned pads 108 has a pad center 1302. Each of the external interconnects 106 has an interconnect center 1304, such as an under bump metallization (UBM) center. One of the external interconnects 106 is aligned over the center pad 204 which has the pad center 1302 and the interconnect center 1304 aligned. The pad center 1302 and the interconnect center 1304 are increasingly misaligned moving away from the center pad 204 between the instance of the radiating patterned pads 108 and the instance of the external interconnects 106 thereover.

An offset 1306 is the misalignment of the pad center 1302 and the interconnect center 1304. The increasing value of the offset 1306 further from the center pad 204 accommodates for the expansion rate difference between the electrical device 102 and the substrate 104.

Figure 14:
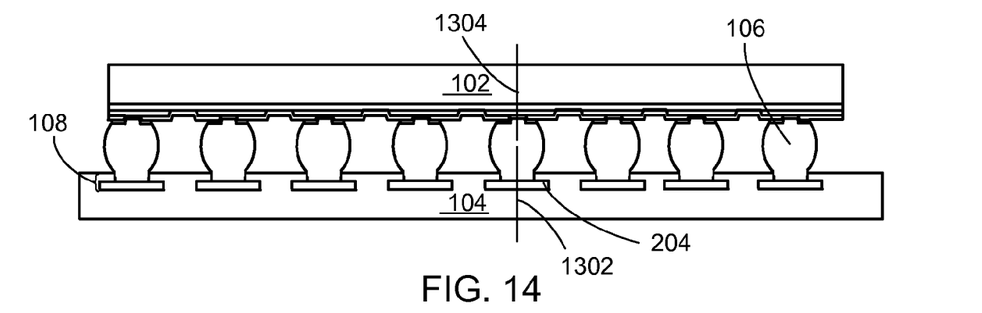
FIG. 14 is the structure of FIG. 13 in a reflowing phase of the electrical device.

Referring now to FIG. 14, therein is shown the structure of FIG. 13 in a reflowing phase of the electrical device 102. The electrical device 102 having the external interconnects 106 and the substrate 104 having the radiating patterned pads 108 undergoes reflow. The reflow process subjects the electrical device 102 and the substrate 104 to elevated temperatures to melt the external interconnects 106 forming electrical and mechanical connections between the external interconnects 106 and the radiating patterned pads 108.

The electrical device 102 and the substrate 104 have different coefficient of thermal expansion (CTE) such that both do not expand at the same rate. For example, the electrical device 102 may expand less or at a slower rate than the substrate 104. The values of the offset 1306 of FIG. 13 preferably increases further away from the center pad 204 accommodating the expansion rate difference between the electrical device 102 and the substrate 104. The radiating patterned pads 108 and the external interconnects 106 thereover are aligned with the pad center 1302 and the interconnect center 1304 substantially aligned after reflow.

Figure 15:
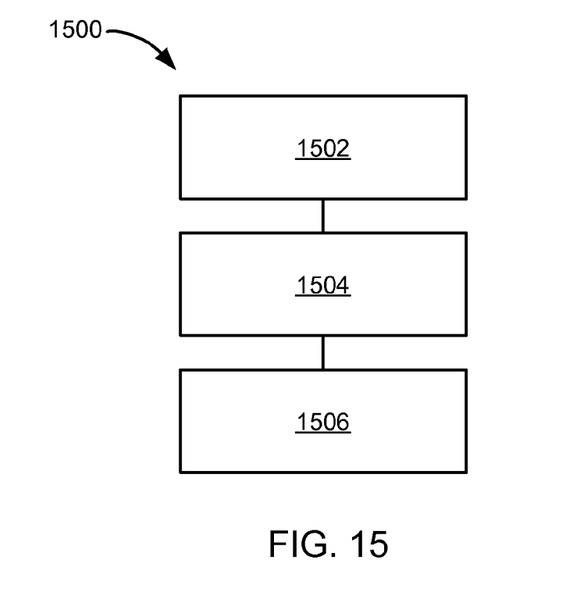
FIG. 15 is a flow chart of an electronic system for manufacturing the electronic system in an embodiment of the present invention.

Referring now to FIG. 15, therein is shown a flow chart of an electronic system 1500 for manufacturing the electronic system 100 in an embodiment of the present invention. The system 1500 includes forming a substrate having a radiating patterned pad in a block 1502; mounting an electrical device having an external interconnect over the radiating patterned pad with the external interconnect offset from the radiating patterned pad in a block 1504; and aligning the external interconnect with the radiating patterned pad in a block 1506.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the electronic system of the present invention furnishes important and heretofore unknown and unavailable solutions, capabilities, and functional aspects for improving yield, increasing reliability, and reducing cost of electronic system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an electronic system comprising:
    forming a substrate having a radiating patterned pad and a center pad, partially embedded within the substrate, and partially exposed and protruded from the substrate, the radiating patterned pad symmetric only along a major axis of the radiating patterned pad where the major axis is orthogonal to a minor axis of the radiating patterned pad with the minor axis longer than a diameter of the center pad, and the major axis is aligned with a center of the substrate;
    mounting an electrical device having an external interconnect over the radiating patterned pad with the external interconnect offset from the radiating patterned pad; and
    aligning the external interconnect with the radiating patterned pad.

2. The method as claimed in claim 1 wherein forming the substrate having the radiating patterned pad includes forming the center pad, an outer pad, and a middle pad in between with the middle pad and the outer pad having substantially the same geometric configuration.

3. The method as claimed in claim 1 wherein forming the substrate having the radiating patterned pad includes forming the center pad, an outer pad, and a middle pad in between with the middle pad and the outer pad having different geometric configurations.

4. The method as claimed in claim 1 wherein mounting the electrical device includes mounting an integrated circuit having an array of external interconnects over radiating patterned pads of the substrate.

5. The method as claimed in claim 1 wherein aligning the external interconnect with the radiating patterned pad includes reflowing the external interconnect over the radiating patterned pad.

6. A method of manufacture of an electronic system comprising:
    forming a substrate having radiating patterned pads, partially embedded within the substrate, and extending from the center of the substrate to the sides of the substrate, and partially exposed and protruded from the substrate includes:
        forming a center pad of the radiating patterned pads,
        forming the radiating patterned pads along radiating lines from the center pad and the radiating patterned pads symmetric only along a major axis of the radiating patterned pads where the major axis is orthogonal to a minor axis of the radiating patterned pad with the minor axis longer than a diameter of the center pad, and the major axis is aligned with the center pad at a center of the substrate;
    mounting an electrical device having an array of external interconnects over and offset from the radiating patterned pads; and
    aligning the external interconnect with the radiating patterned pad.

7. The method as claimed in claim 6 wherein forming the substrate having the radiating patterned pads includes forming the center pad having a circular geometric configuration, an outer pad, and a middle pad in between with the middle pad and the outer pad having substantially the same non-circular geometric configuration.

8. The method as claimed in claim 6 wherein forming the substrate having the radiating patterned pads includes forming the center pad having a circular geometric configuration, an outer pad, and a middle pad in between with the middle pad and the outer pad having different non-circular geometric configurations.

9. The method as claimed in claim 6 wherein forming the substrate having the radiating patterned pads includes forming the center pad having a circular geometric configuration, an outer pad, and a middle pad in between with the middle pad and the outer pad having substantially the same elliptical or oval geometric configuration.

10. The method as claimed in claim 6 wherein forming the substrate having the radiating patterned pads includes forming the center pad having a circular geometric configuration, an outer pad, and a middle pad in between with the middle pad and the outer pad having different elliptical or oval geometric configurations.

11. An electronic system comprising:
    a substrate having a radiating patterned pad and a center pad, partially embedded within the substrate, and partially exposed and protruded from the substrate, the radiating patterned pad symmetric only along a major axis of the radiating patterned pad where the major axis is orthogonal to a minor axis of the radiating patterned pad with the minor axis longer than a diameter of the center pad, and the major axis is aligned with a center of the substrate; and
    an electrical device having an external interconnect over the radiating patterned pad.

12. The system as claimed in claim 11 wherein the substrate having the radiating patterned pad includes:
    the center pad;
    an outer pad; and
    a middle pad between the center pad and the outer pad, the middle pad and the outer pad having substantially the same geometric configuration.

13. The system as claimed in claim 11 wherein the substrate having the radiating patterned pad includes:
    the center pad;
    an outer pad; and a middle pad between the center pad and the outer pad, the middle pad and the outer pad having different geometric configurations.

14. The system as claimed in claim 11 wherein the electrical device includes an integrated circuit having an array of external interconnects over radiating patterned pads of the substrate.

15. The system as claimed in claim 11 wherein the external interconnect is aligned over the radiating patterned pad.

16. The system as claimed in claim 11 wherein:
the substrate has radiating patterned pads extending to sides of the substrate exposed from the substrate with the center pad and the radiating patterned pads are along radiating lines from the center pad, and the radiating patterned pads symmetric only along a major axis of the radiating patterned pads where the major axis is orthogonal to a minor axis of the radiating patterned pads; and
the electrical device has an array of external interconnects over the radiating patterned pads.

17. The system as claimed in claim 16 wherein the substrate having the radiating patterned pads includes:
the center pad having a circular geometric configuration;
an outer pad; and
a middle pad between the center pad and the outer pad, the middle pad and the outer pad having different geometric configurations.

18. The system as claimed in claim 16 wherein the substrate having the radiating patterned pads includes:
the center pad having a circular geometric configuration;
an outer pad; and
a middle pad between the center pad and the outer pad, the middle pad and the outer pad having substantially the same non-circular geometric configuration.

19. The system as claimed in claim 16 wherein the substrate having the radiating patterned pads includes:
the center pad having a circular geometric configuration;
an outer pad; and
a middle pad between the center pad and the outer pad, the middle pad and the outer pad having different non-circular geometric configurations.

20. The system as claimed in claim 16 wherein the substrate having the radiating patterned pads includes:
the center pad having a circular geometric configuration;
an outer pad; and
a middle pad between the center pad and the outer pad, the middle pad and the outer pad having substantially the same elliptical or oval geometric configuration.

21. The system as claimed in claim 16 wherein the substrate having the radiating patterned pads includes:
the center pad having a circular geometric configuration;
an outer pad; and
a middle pad between the center pad and the outer pad, the middle pad and the outer pad having different elliptical or oval geometric configurations.

* * * * *